United States Patent [19]

Poleshuk et al.

[11] 4,389,481
[45] Jun. 21, 1983

[54] METHOD OF MAKING PLANAR THIN FILM TRANSISTORS, TRANSISTOR ARRAYS

[75] Inventors: Michael Poleshuk; Joseph J. Wysocki, both of Webster, N.Y.

[73] Assignee: Xerox Corporation, Stamford, Conn.

[21] Appl. No.: 155,335

[22] Filed: Jun. 2, 1980

[51] Int. Cl.³ .......................................... H01L 21/84
[52] U.S. Cl. .................................... 430/319; 430/311; 430/315; 427/86; 427/96; 427/259; 29/571
[58] Field of Search .......................... 427/86, 96, 259; 430/311, 319, 315; 29/571

[56] References Cited

U.S. PATENT DOCUMENTS

| 3,669,661 | 6/1972 | Page | 430/314 |
|---|---|---|---|
| 4,035,276 | 7/1977 | Havas | 204/192 E |
| 4,040,073 | 8/1977 | Luo | 357/4 |
| 4,040,854 | 8/1977 | Luo et al. | 313/505 |
| 4,055,885 | 11/1977 | Takemoto | 29/578 |
| 4,090,006 | 5/1978 | Havas | 427/89 |
| 4,181,755 | 1/1980 | Liu | 427/99 |

OTHER PUBLICATIONS

Brody et al., "A 6×6 Inch 20 Lines-Per-Inch Liquid Crystal Display Panel", IEEE Transactions of Electron Devices, vol. ED-20, No. 11, Nov. 1973.

Primary Examiner—John D. Smith

[57] ABSTRACT

A planar thin film transistor is described wherein each element of the transistor structure is disposed in a planar relationship with respect to the next adjacent layer. The method of manufacture generally includes the steps of depositing one of the elemental members of a thin film transistor structure and filling in the valleys between the elemental structure with an insulating material to form a planar surface which, in turn, forms the surface upon which the next planar layer is formed.

3 Claims, 17 Drawing Figures

METHOD OF MAKING PLANAR THIN FILM TRANSISTORS, TRANSISTOR ARRAYS

BACKGROUND OF THE INVENTION

This invention relates to thin film transistors, thin film transistor arrays, and a method of preparing the same.

It has been heretofore proposed to utilize thin film transistors and particularly an array of thin film transistors to control and drive display panels such as, for example, liquid crystal displays, electroluminescent mediums and the like. Thin film transistors in this application offer an attractive substitute to the utilization of silicon technology because of the size limitation problems associated with that technology. A large number of thin film transistors can be prepared within any given size area and in a density satisfactory for pictorial presentation. Examples of thin film transistors and associated display panels are set forth in U.S. Pat. Nos. 4,040,073 and 4,042,854.

Fabrication of thin film transistor arrays requires the generation of well defined geometric patterns of metals, semiconductors and insulators. These are deposited in layers to form the transistor structures and circuit interconnections. Patterns can be generated by shadow masking or photolithographic methods. The first, a popular classic method, relies on a series of mechanical masks to define pattern geometries while shielding the remainder of the substrate from the deposition source. The photolithographic method is attractive for cost effective fabrication of large area circuits containing a high density of components.

There are two photolithographic fabrication processes, the subtractive and the additive. In the subtractive process, patterned photoresist layers mask desired areas of deposited materials while unwanted regions are removed by any suitable means, such as, chemical etching, plasma etching, ion milling or the like. In the additive process, unwanted regions are masked by photoresist layers prior to the deposition of the material. Immersion of the substrate in a suitable solvent for the photoresist layer dissolves the photoresist material thereby lifting away the unwanted material and leaving on the substrate a well defined circuit pattern. Alternatively, by means of a stripping, such as, plasma stripping, may be used to remove both the photoresist and unwanted material.

Two critical technological tasks encountered in the fabrication of multi-layered thin film transistor arrays are the formation of electrical contact between circuit elements located at different levels and the electrical isolation of conductors crossing over patterns of metals and semiconductor. In one configuration of thin film transistors, semiconductor films extend from the substrate level to source-drain pads at the next level. The gate oxide and electrode must follow this contour. Gate structures and crossovers form the third and fourth layers. Topography of the completed device is that of multilayered mesas with varied geometries and individual heights which range from about 100 Angstroms to several thousand Angstroms. Coverage of mesa steps with continuous films of uniform thickness poses difficulties due to the sharply defined vertical edges of patterns delineated by processing steps such as the photolithographic fabrication process briefly described above. Because of the sharp edges, the subsequently deposited layers as they form over the sharp edges are thinner than on the planar surface of the patterns previously prepared. This thinning causes open or shorted devices to occur. It can be readily seen that, in a display device where pictorial presentation is desired, substantially all of the thin film transistors must be operative in order to prevent imperfections in the completed display device.

Accordingly, it is a primary object of this invention to provide a planar thin film transistor.

It is another object of this invention to provide a thin film transistor array wherein the plurality of thin film transistors forming a part of the array are planar in nature.

It is still another object of this invention to provide a method of making planar thin film transistors.

| Page et al | U.S. Pat. No. 3,669,661 | June 13, 1972 |
|---|---|---|
| Havas et al | U.S. Pat. No. 4,035,276 | July 12, 1977 |
| Luo | U.S. Pat. No. 4,040,073 | Aug. 2, 1977 |
| Luo et al | U.S. Pat. No. 3,042,854 | Aug. 16, 1977 |
| Takemoto | U.S. Pat. No. 4,055,885 | Nov. 1, 1977 |
| Havas et al | U.S. Pat. No. 4,090,006 | May 16, 1978 |

IEEE TRANSACTIONS OF ELECTRON DEVICES, Vol. ED-20, No. 11, November 1973, "A 6 × 6 Inch 20 Lines-per-Inch Liquid-Crystal Display Panel", T. P. Brody, Juris A. Asars, and Douglas Dixon.

A brief description of the publications cited above follows immediately below.

Page et al. discloses a method of producing a thin film transistor on a substrate by evaporating layers of various materials from sources positioned at various angles to the substrate normal.

Havas et al. ('276 and '006) relates to a method of forming coplanar thin films on a substrate by forming a pattern of a first thin film and an expendable material. Depositing a second thin film by RF sputtering at a bias and etching away the expendable material.

Luo discloses a double gated thin film field effect transistor wherein cadmium selenide is the semiconducting material, indium is provided on either side of the conducting channel to enhance transconductance and the source and drain contacts are a combination of an indium layer and a copper layer.

Luo et al. discloses a large area flat panel solid-state display in which thin film transistor addressing and control circuitry are integrally connected to the display medium.

Takemoto discloses a method of making a charge coupled semiconductor device whereby oxide regions are formed on sides of a first series of electrodes which face each other and positioning a second series of electrodes between the oxide regions.

The IEEE article describes an integrated 14,000 picture element 36-in$^2$ flat screen display panel constructed by a combination of thin-film transistor-nematic liquid-crystal technology.

SUMMARY OF THE INVENTION

Accordingly, the invention contemplates planar thin film transistors and an array of a plurality of thin film transistors each of which includes a plurality of layers including a semiconductor layer, at least one gate electrode layer, an insulating layer between each gate electrode layer and the semiconducting layer and a source and drain electrode layer, some or each of these layers forming a planar surface with the next adjacent layer, wherein each of the gate and source and drain electrode layers includes well defined patterns of conductive areas with the areas between the conductive areas filled with an insulating material of substantially the same thickness, the semiconducting layer including well defined patterns of semiconducting material areas with the areas therebetween filled with an insulating material of substantially the same thickness as that of the semiconductor.

Thus, the invention contemplates a thin film transistor or an array of thin film transistors wherein the transistors are formed on a substrate by the sequential deposition of a series of layers wherein each layer forms a planar surface for the deposition of the next succeeding layer. In the preparation thereof, the initial layer which is deposited directly upon a suitable substrate may be either the gate layer or the source and drain layer. When the initial layer is the gate layer, the well defined gate patterns of conductive material are deposited directly onto the substrate. The areas unoccupied by the conductive material are next filled in to the same depth as the thickness of the gate material with an insulating material thereby forming a substantially planar surface for the deposition of the next layer, which in this case would be the insulating layer. Insulating material is then deposited uniformly across the planar surface of the gate layer to the desired depth. The well defined semiconducting material patterns are next deposited on this planar surface and the areas between the well defined semiconducting material patterns are filled in to the same depth with an insulating material thereby forming another substantially planar surface. Finally, the source and drain discrete pattern areas are deposited in relationship to each of the semiconducting material areas and the areas therebetween filled in with an insulating material to thereby form a planar single-gated thin film transistor structure. With respect to the individual layers and conductive electrode patterns formed, the connecting conductors, for example, bus lines, may be deposited simultaneously with the deposition of the discrete pattern areas. The process can be continued to form double-gated structures.

BRIEF DESCRIPTION OF THE DRAWINGS

Other objects and advantages of the present invention will become apparent from the following detail description with reference to the accompanying drawings, in which.

While the present invention will hereinafter be described in connection with preferred embodiments thereof, it will be understood that it is not intended to limit the invention to these embodiments. On the contrary, it is intended to cover all alternatives, modifications, and equivalents as may be included within the spirit and scope of the invention as defined by the appended claims.

DETAILED DESCRIPTION OF THE INVENTION

Figure 1:
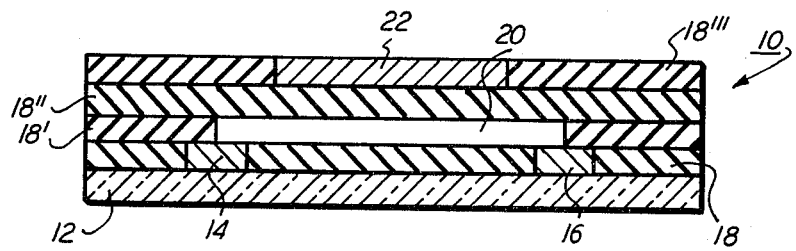
FIG. 1 is a cross-sectional view through the center of a single-gated thin film transistor in accordance with this invention.
Figure 2:
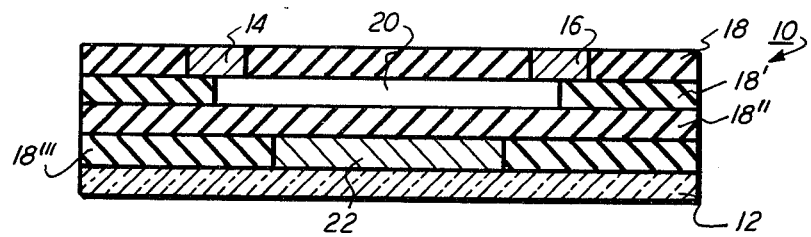
FIG. 2 is a cross-sectional view through a second embodiment of a thin film transistor in accordance with this invention.
Figure 3:
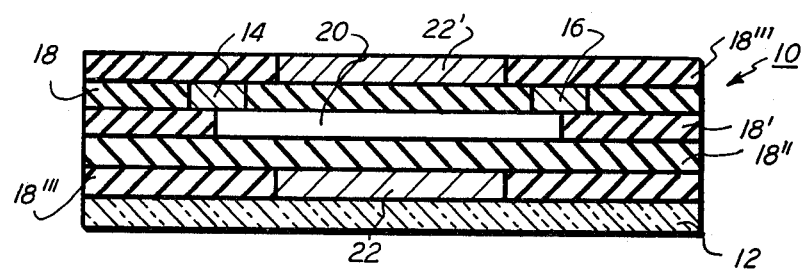
FIG. 3 is a cross-sectional view through a double-gated thin film transistor in accordance with this invention.

For a general understanding of the invention, reference is had to the drawings in which like reference characters have been used throughout to indicate like parts. FIGS. 1-3 represent various embodiments of a thin film transistor device 10. FIG. 1 illustrates an embodiment wherein the source and drain are adjacent to the substrate, while FIGS. 2 and 3 indicate two embodiments wherein the gate electrode is formed adjacent to the substrate.

Referring specifically to FIG. 1, substrate 12 illustrated herein as a planar glass plate has disposed thereon source electrode 14 and drain electrode 16. The areas between the source and drain electrodes are filled in to the same depth with insulating material 18. This provides a planar surface for the deposition of the next adjacent layer, which includes a semiconductive material in a predetermined distinct area pattern shown as reference character 20. After deposition of the semiconductive patterns 20, the areas between the semiconductive patterns of the array are filled in with insulating material 18' in order to provide a planar surface for deposition of the next adjacent layer, which in this case is insulating layer 18". This insulating layer 18" disposed between the semiconductor and the gate layer is the gate insulator. The next layer incorporates the gate electrodes 22 of the thin film transistor array. Insulating material 18''' is then deposited in a thickness substantially equal to the thickness of the gate electrode in order to prepare a completely planar thin film transistor.

FIG. 2 is similar in nature to the embodiment illustrated in FIG. 1 with the exception that the gate electrode 22 is deposited directly onto substrate 12 and the remaining layers of the thin film transistor are in the reverse order as that illustrated in FIG. 1. As shown in FIG. 2, adjacent to the layer formed by gate electrode 22 and the insulating material 18''' deposited in a thickness equivalent to that of the gate electrode material 22 is deposited a substantially uniform layer 18" of insulating material. In the preparation of a thin film transistor array, this layer 18" would uniformly coat the entire first layer of a plurality of gate electrodes 22 separated from each other by insulating material 18''' deposited between the gate electrodes 22 and of a uniform thickness. The uniform insulating layer 18" thus provides a planar surface for the deposition of the semiconductive pad 20, or in the case of an array of thin film transistors a plurality of semiconductive pads disposed in field effect transistor relationship with respect to the gate electrodes 22. The areas between the semiconductive pads 20 are filled in to a thickness substantially equal to that of the semiconductor material by insulating material 18'. On the planar surface formed by the semiconductive material 20 and the insulating material 18' is disposed source electrode 14 and drain electrode 16. The areas between the electrodes and between all of those deposited for a thin film transistor array are filled in with an insulating material 18 to provide a completely planar thin film transistor which has especially suitable utility in the driving of a display device such as a liquid crystal or electroluminescent display.

FIG. 3 illustrates still another embodiment whereon the planar surface formed by the source and drain electrodes and the insulating material 18 of FIG. 2 is disposed a second gate electrode 22' thereby forming a double-gated thin film transistor. It will be noted that the area surrounding the gate electrodes 22' is filled in to an equal depth with the further amount of insulating material 18'''. In this embodiment, it is also suitable to reverse the position of the source 14—drain 16—insulating 18 layer with that of the semiconductor 20—insulating 18' layer and provide an additional insulating layer between the semiconductor and gate 22'.

In the thin film transistors ilustrated in FIGS. 1-3 and throughout the remainder of the specification, it is pointed out that the materials employed therein may be any of those suitable for the utility employed. For example, the substrate may be any planar insulative material such as, for example, glass, ceramics, plastic materials including polymethylmethacrylate, Mylar, polyvinyl polymers, and the like. It is desirable that the substrate material be transparent or semi-transparent, however, opaque materials are also operable.

The source and drain electrodes and also the conductors, or bus lines, to the source electrode can be prepared from any suitable material known in the art such as, for example, chromium, gold, indium, silver, aluminum, nickel, and the like. Further, a combination of these materials may be desirable, for example, a chromium-gold-indium composition is advantageous in certain applications. The gate electrode may be any of those materials previously mentioned above with respect to the source and drain electrodes and, in addition, may be aluminum, tin, copper, platinum, and the like. The gate line or bus connections can also be any of these materials, however, aluminum is generally used for this purpose.

The semiconductive areas may be any suitable material known in the thin film transistor art such as, for example, cadmium selenide, tellurium, cadmium sulfide, silicon, indium arsenide, gallium arsenide, tin oxide, lead telluride, and the like. Further, it should be understood that the semiconducting areas may be themselves deposited in layer formation such as that described in U.S. Pat. No. 4,040,073 wherein an indium-covered cadmium selenide semiconductive area is set forth.

The insulating layer may be any suitable insulating material such as, for example, aluminum oxide, silicon monoxide, silicon dioxide, calcium fluoride, magnesium fluoride, organic polymers including polymers of hexachlorobutadiene, divinylbenzene, aryl sulfones, fluorinated alkenyls, such as, for example, polytetrafluoroethylene polymers, paraxylene, and the like.

In the preparation of the devices in accordance with the embodiment shown in FIGS. 1-3, the thickness of the various layers has been established heretofore and the thickness thereof of each of the layers should be in accordance with these specifications. For example, the semiconductive layer will generally vary with the type of material employed therein and can vary from about 40 Angstroms for a tellurium layer to a thickness of from 100 to 2,000 Angstroms for the remaining material, particularly cadmium selenide. With respect to the insulating layer, the layer should be thick enough that no opens or pin-holes through the layer can be detected. Thus, a thickness of the gate insulating layer should be greater than 100 Angstroms, and preferably from about 1,000 to about 3,000 Angstroms. The source and drain electrodes and the gate electrode should vary from about 300 to about 1,000 Angstroms, and preferably from about 500 to 1,000 Angstroms.

Figure 4A:
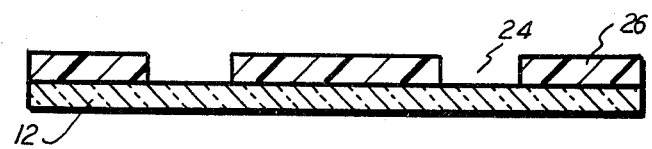
FIGS. 4A-G are diagrammatic cross-sectional views illustrating one method of preparing the first layer adjacent the substrate.
Figure 4B:
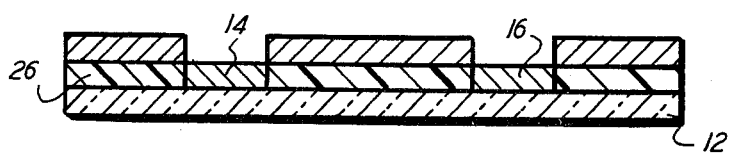
Figure 4C:
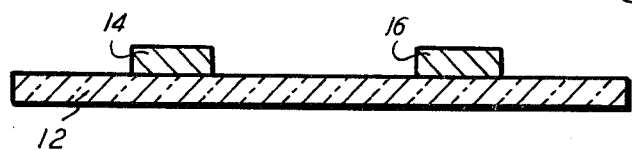
Figure 4D:
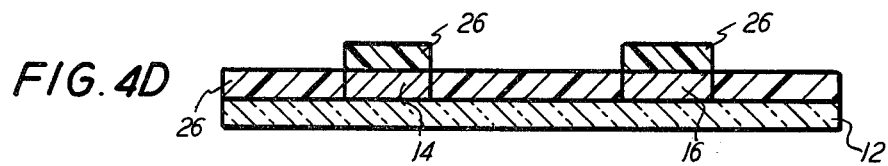
Figure 4E:
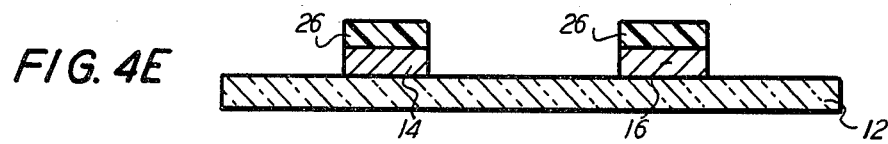
Figure 4F:
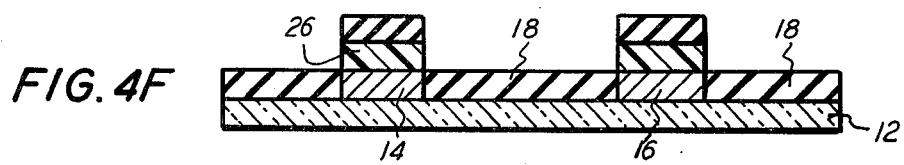

In the preparation of a thin film transistor or an array of thin film transistors, a substrate is employed as the structure member necessary for the formation thereon of the device or devices. For example, the source and drain electrodes can be evaporated in the correct physical location on the substrate through a suitable metal mask by operating in vacuum. Subsequent to this, the areas previously deposited that form the source and drain electrodes and, if desirable, also the connecting conductor to the source can be masked and the insulating material evaporated in a thickness substantially equivalent to that of the thickness of the source and the drain. This technique can be employed with respect to each of the layers deposited onto the substrate in sequence to form a completed thin film transistor. However, as shown in FIGS. 4A through G, it is a preferred technique to employ the additive photolithographic method for the preparation of the initial layer and also subsequent layers. As shown in FIG. 4A, substrate 12, a glass plate, has deposited thereon a suitable photoresist material which upon exposure is chemically altered and can easily be removed in the exposed regions by aqueous solutions. A suitable photoresist material is Shipley AZ 1360 J sold by Shipley Co., Inc., Newton, Mass. The photoresist material is initially uniformly coated over the glass substrate 12 and then exposed through a suitable masking arrangement which may be a photographic slide having the desired configuration thereon to expose the photoresist in the areas 24. The photoresist is then immersed in a solvent for the exposed material which upon dissolution leaves the photoresist intact in the areas 26. The substrate bearing the photoresist 26 may then be installed in a suitable vacuum device and the source and drain materials set forth above evaporated uniformly over the surface to fill the areas previously dissolved away from the photoresist to the desired thickness for the source 14 and drain 16. The remaining portion of the resist shown as areas 26 in FIG. 4B are then dissolved by the action of a suitable solvent such as acetone, for example, to leave the structure shown in 4C. A second application of a photoresist material is made to the structure of 4C in order to provide the structure of FIG. 4D having photoresist material on the substrate and also over the source and drain pads previously applied to the substrate 12. The structure as shown in FIG. 4D is next exposed and a convenient method of exposure is from the substrate side of the assembly since the source 14 and drain 16 electrodes previously applied thereto serve as a well defined mask. The photoresist in the exposed areas is once again removed by solution in a solvent only for the exposed regions leaving areas 26 over the source and drain electrodes. Once again, the assembly is inserted into a vacuum device and a layer of an insulating material such as $Al_2O_3$, for example, is uniformly evaporated onto the exposed surfaces thereby yielding a structure as shown in FIG. 4F. Upon dissolution of the photoresist material 26 of FIG. 4F, the planar configuration of FIG. 4G having a substrate 12 with a source electrode 14, a drain electrode 16 and insulating areas 18 results. It is, of course, to be understood that, if a configuration of either FIG. 2 or FIG. 3 is desired, a gate electrode would be deposited initially onto the substrate 12 in place of the source and drain electrodes as described in FIGS. 4A–G.

Figure 4G:
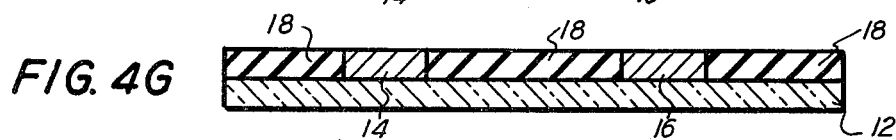

The remaining steps of the procedure will be described with respect to FIGS. 5A–F. In this regard, the structure illustrated in FIG. 4G is uniformly coated with a photoresist material, and the photoresist material is exposed in a manner to cause photochemical decomposition of the photoresist in the area of FIG. 5A marked 28. This area corresponds to the area wherein the semiconductive material will be subsequently evaporated. In a fashion similar to that explained with respect to FIG. 4A–G, the semiconductive material 20 is evaporated into the areas 28 previously removed from the photoresist material. Of course, the semiconductive material also forms over the photoresist areas indicated as 30 in FIG. 5A. Upon dissolution of the photoresist material in a solvent, the structure illustrated in FIG. 5B results. Again, in a manner similar to that explained above with respect to FIGS. 4A–G, a photoresist material is uniformly spread over the structure indicated in FIG. 5B and exposed in order that only the areas immediately above the semiconductive material 20 are protected by photoresist material 26. Insulating material 18' is then applied in a thickness substantially equivalent to the thickness of the semiconductive material 20. In each of the applications of insulating material previously described and in those to follow, the thickness of the insulating material can be accurately controlled by a resonating quartz-crystal thickness-monitor-head and a Sloan MDC 9000 Digital Deposition Controller, manufactured by Sloan Technology Corporation, 535 East Montecito Street, Santa Barbara, Calif. Subsequent to the addition of the insulating material 18', the resist material 26 is dissolved away thereby also dissolving away the insulating material applied over the resist material.

Figure 5A:
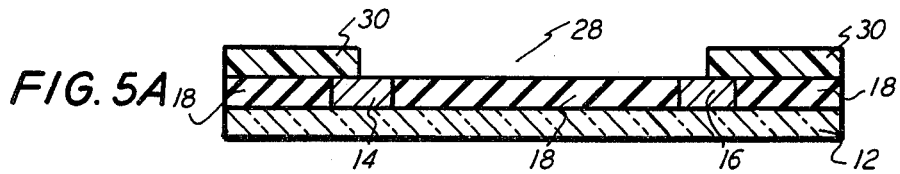
FIGS. 5A-F are diagrammatic cross-sectional views illustrating the method of completing a thin film transistor in accordance with this invention.
Figure 5B:
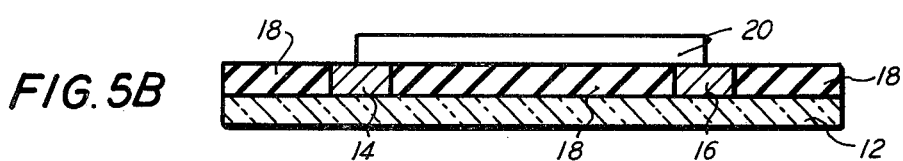
Figure 5C:
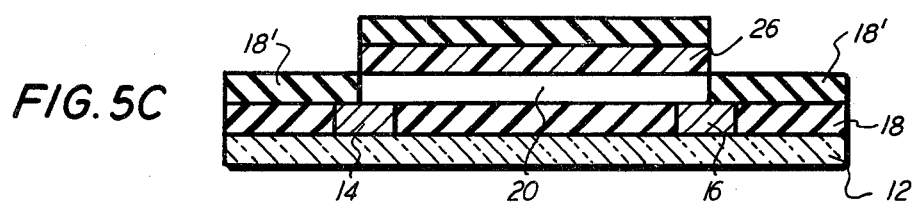
Figure 5D:
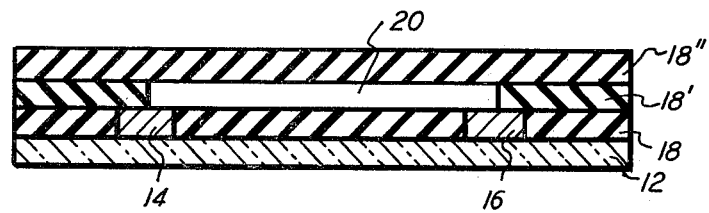
Figure 5E:
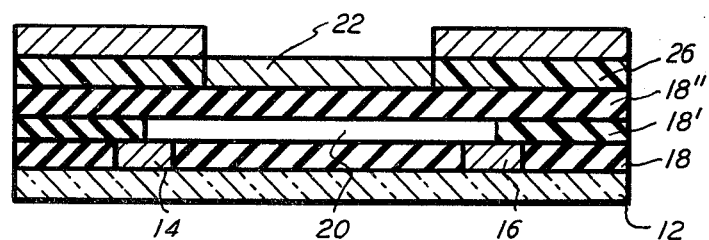
Figure 5F:
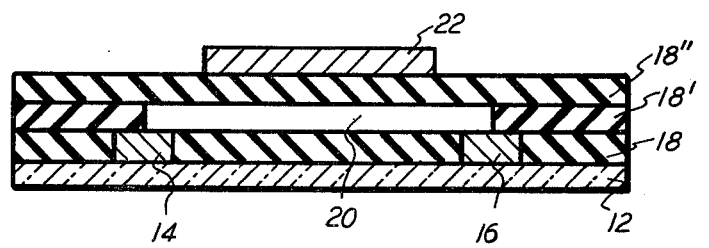

The next step in the fabrication of the thin film transistor is to uniformly deposit insulating layer 18" over the entire planar surface formed by the semiconductive layer and the insulating material 18' deposited between the semiconductive layers, for example, in a thin film transistor array. This yields the structure exhibited in FIG. 5D. Once again, a uniform layer of resist material is applied to the gate insulating layer 18" and the areas into which the gate electrode is to be deposited exposed through a suitable mask and dissolved away. Subsequently, gate electrode material 22 is deposited over the entire surface thereof and as illustrated in FIG. 5E. Upon removal of the resist material 26, which also removes the metallic material deposited immediately above the photoresist material 26 shown in FIG. 5E, a structure as illustrated in 5F results. At this point, if it is desired, or is necessary for the ultimate application of the thin film device or array of thin film transistors, the photoresist technique may be employed once again in order to mask the areas immediately above the gate electrode 22 of FIG. 5F for the deposition of the final layer of insulating material which will yield a structure identical to that shown in FIG. 1.

It is, of course, to be understood that a variety of techniques and combinations of techniques can be employed in the fabrication process in accordance with this invention. For example, any combination of photolithographic techniques and masking techniques may be employed herein in order to further simplify this process. In an exemplary manner, for example, in FIG. 5B it would be a suitable method rather than to follow the photolithographic techniques described hereinabove to evaporate the semiconducting pads through a masking device. In fact, in the same manner, any of these steps can be altered by utilizing masking techniques rather than those described above with respect to the photolithographic technique. Another embodiment that may be carried out would be with respect to the step forming the device as shown in FIG. 5D. For example, when the insulating layer 18' formed between the semiconducting pads 20 is being formed, an additional quantity of insulating material could be permitted to cover the semiconductive area directly rather than by interposing initially between the semiconductive layer and the insulating layer a photoresist material. Subsequent to this, a photolithographic masking technique could be once again employed to cover the insulating material above the semiconductive device 20 and the areas where depressions will be left in the insulating material filled in by a further evaporating step. Further, modifications and alterations of the process steps in accordance with this invention will become apparent to those skilled in the art in order to prepare planar thin film transistors in accordance with this invention.

Figure 6:
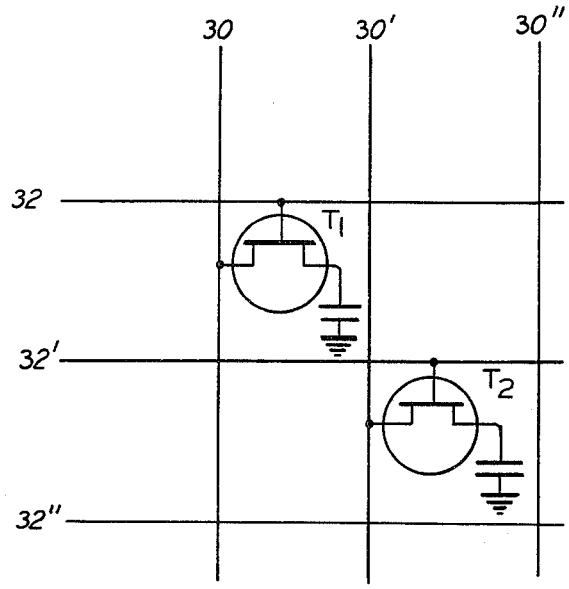
FIG. 6 is a schematic representation of a thin film transistor array illustrating two thin film transistors and the connecting conductors.

FIG. 6 is a schematic representation of two thin film transistors which form a part of a larger thin film transistor array together with their associated connecting buses or conductors. In this regard, columns of conductors 30, 30' and 30" are shown. Conductor 30 is connected to the source of transistor $T_1$. Gate conductors or buses 32, 32' and 32" are shown and conductor 32', for example, is connected to the gate electrode of thin film transistor $T_2$. Each of the thin film transistors controls one picture element of a display device, for example, a liquid crystal display device. In each case, in the simplified circuit diagram shown herein, the drain electrode of each thin film transistor forms one of the conductive layers of a liquid crystal element. The other conductive layer of the liquid crystal element is connected to ground. By controlling the thin film transistor, the liquid crystal is controlled with respect to the presentation of image information. By controlling all of the thin film transistors of the array, pictorial, alpha numeric or other information is exhibited on the display device. This arrangement is set forth herein for the purpose of illustration. It is, of course, understood by those skilled in the art that more complex circuit arrangements can be employed, for example, an additional storage capacitor can be employed in the circuit as shown with respect to each thin film transistor of FIG. 6. Further, other display devices, for example, electroluminescent devices and the like may be controlled utilizing the planar thin film transistors and arrays in accordance with this invention.

What is claimed is:

1. A process of preparing a planar thin film transistor on a substrate by forming in sequential or in reverse sequential order layers 1, 2, 3 and 4 on the substrate which comprises:
   forming layer 1 by depositing a gate electrode on a discrete area of a light transmitting substrate, said gate electrode having a given thickness;
   depositing a photoresist material over the substrate and the gate electrode;
   exposing the photoresist material through the substrate so that the gate electrode serves as a mask thereby eliminating the concern about photomask alignment;

removing the exposed photoresist material leaving the unexposed photoresist material covering the gate electrode;

depositing an insulating material on the substrate and the photoresist covered gate electrode to a depth substantially equal to the thickness of the gate electrode in the area unoccupied by the gate electrode;

removing the insulating material and photoresist material from the gate electrode by dissolution of the photoresist material so that the insulating material left on the substrate together with the gate electrode form a planar layer on the substrate of substantially uniform thickness;

forming layer 2 by depositing on said substantially planar surface of layer 1 a layer of insulating material having a substantially uniform thickness;

forming layer 3 by depositing on said uniform layer 2 of insulating material a layer of semiconducting material, said semiconducting material being in a discrete area in field effect transistor positional relationship with said gate electrode, depositing an insulating material on said uniform layer of insulating material in the areas unoccupied by said semiconducting material to a depth substantially equal to the thickness of the semiconducting material, to form a substantially planar surface of uniform thickness; and forming layer 4 by depositing on said substantially planar surface of layer 3 in discrete areas thereof a source electrode and a drain electrode, said source electrode and drain electrode being in field effect transistor positional relationship with respect to said semiconducting material, and depositing an insulating material on said substantially planar surface of layer 3 in the areas unoccupied by said source and drain electrodes to a depth substantially equal to the thickness of the source electrode and drain electrode.

2. A process of preparing an array of planar spaced apart thin film transistors arranged on a light transmitting substrate by forming in sequential or in reverse sequential order, layers 1, 2, 3 and 4 on the substrate which comprises:

forming layer 1 by:
(a) depositing a plurality of gate electrodes and electrical connections thereto on the substrate,
(b) depositing a photoresist material over the substrate including the gate electrode and electrical connections;
(c) exposing the photoresist material through the substrate,
(d) removing the photoresist in exposed regions,
(e) depositing an insulating material over the entire surface to a thickness substantially equal to the thickness of the gate electrode and electrical connections thereto, and
(f) removing the photoresist material and thereby the insulating material immediately above the gate electrode and electrical connections;

forming layer 2 by depositing on said first substantially planar surface of layer 1 a substantially uniform layer of insulating material;

forming a layer 3 by depositing on said uniform layer 2 of insulating material a plurality of discrete areas semiconducting material, said semiconducting material areas being in field effect transistor positional relationship with said gate electrodes, depositing an insulating material on said uniform layer of insulating material in the areas unoccupied by said semiconducting material to a depth substantially equal to the thickness of the semiconducting material to thereby form a substantially planar surface; and forming layer 4 by depositing on said substantially planar surface of layer 3 in discrete areas thereof a plurality of source electrode-drain electrode pairs and electrical connections thereto, each source electrode-drain electrode pair being infield effect transistor positional relationship with respect to each discrete area of semiconducting material of layer 3, and depositing an insulating material on said substantially planar surface of layer 3 in the areas unoccupied by said source electrode-drain electrode pairs and electrical connections thereto, to a depth substantially equal to the thickness of the source electrode-drain electrode pairs an the electrical connections.

3. A method of making a planar thin film transistor having a uniformly thick planar layer containing a discrete area of semiconductive material that is parallel to a uniformly thick planar layer containing a source and a drain electrode, the semiconductive material being in contact with the source and drain electrodes, wherein the method comprises the steps of:

depositing a source electrode and a drain electrode of uniform thickness on a light transmitting substrate;

depositing a photoresist material over the substrate including the source and drain electrodes;

exposing the photoresist material through the substrate so that the source and drain electrode serve as a mask thereby eliminating the concern about mask alignment;

removing the exposed photoresist material leaving the unexposed photoresist material covering the source and drain electrodes;

depositing a layer of insulating material on the substrate including the source and drain electrodes covered by photoresist material, the thickness of the layer of insulating material contacting the substrate being substantially the same thickness as the source and drain electrodes;

removing the insulating material and photoresist material from the source and drain electrodes by dissolution of the photoresist material so that the insulating material left on the substrate together with the source and drain electrodes form a planar layer on the substrate of substantially uniform thickness;

depositing a uniform layer of semiconductive material in a discrete area on the layer containing the insulating material and the source and drain electrodes, the layer of semiconductive material being parallel to and in contact with the source and drain electrodes so that there is a field effect transistor positional relationship between the semiconductive material layer and said source and drain electrodes;

depositing an insulating material around the discrete area of semiconductive material and having the same thickness thereof in order to form a complete planar layer of substantially uniform thickness over the layer containing the source and drain electrodes;

depositing an insulating layer of uniform thickness over the layer containing the semiconductive material;

forming a layer of gate electrode material in a discrete area on the layer of insulating material that is between the gate electrode and layer containing the semiconductive material, the layer of gate electrode material being parallel to the semiconductive material layer and in a field effect transistor positional relationship therewith; and depositing an insulating material around the discrete area of gate electrode material and having the same thickness thereof in order to form a complete planar layer of substantially uniform thickness.

* * * * *